United States Patent
Brenguier

(10) Patent No.: US 11,451,148 B2
(45) Date of Patent: Sep. 20, 2022

(54) VOLTAGE-REGULATING CIRCUIT AND REGULATED POWER-SUPPLY MODULE

(71) Applicant: Schneider Electric Industries SAS, Rueil-Malmaison (FR)

(72) Inventor: Jérôme Brenguier, L'Albenc (FR)

(73) Assignee: Schneider Electric Industries SAS, Rueil Malmaison (FR)

(*) Notice: Subject to any disclaimer, the term of this patent is extended or adjusted under 35 U.S.C. 154(b) by 189 days.

(21) Appl. No.: 17/032,978

(22) Filed: Sep. 25, 2020

(65) Prior Publication Data
US 2021/0099086 A1    Apr. 1, 2021

(30) Foreign Application Priority Data

Oct. 1, 2019 (FR) ...................................... 1910872

(51) Int. Cl.
| | |
|---|---|
| H02M 3/158 | (2006.01) |
| H02M 3/156 | (2006.01) |
| H02M 7/219 | (2006.01) |
| H03K 5/24 | (2006.01) |
| H02M 1/00 | (2006.01) |

(52) U.S. Cl.
CPC .......... *H02M 3/158* (2013.01); *H02M 7/219* (2013.01); *H03K 5/24* (2013.01); *H02M 1/0006* (2021.05); *H02M 1/0025* (2021.05); *H02M 3/156* (2013.01)

(58) Field of Classification Search
CPC ..... H02M 3/156; H02M 3/158; H02H 7/1206
See application file for complete search history.

(56) References Cited

U.S. PATENT DOCUMENTS

| | | | |
|---|---|---|---|
| 4,754,388 A | 6/1988 | Pospisil | |
| 5,216,351 A * | 6/1993 | Shimoda | H02M 3/156 323/224 |
| 5,652,825 A | 7/1997 | Schmider et al. | |
| 6,094,040 A | 7/2000 | Meier et al. | |
| 6,552,517 B1 * | 4/2003 | Ribellino | H02M 1/36 323/285 |

(Continued)

FOREIGN PATENT DOCUMENTS

| | | |
|---|---|---|
| DE | 3304759 A1 | 8/1984 |
| EP | 0600384 A2 | 6/1994 |

(Continued)

OTHER PUBLICATIONS

National Institute of Industrial Property (France) Search Report and Written Opinion for Application No. FR 1910872 dated Jun. 15, 2020, 9 pages.

*Primary Examiner* — Gary A Nash
(74) *Attorney, Agent, or Firm* — Locke Lord LLP

(57) ABSTRACT

A voltage-regulating circuit comprising:
a voltage regulator,
a switch,
a first comparing circuit for comparing the amplitude deviation between the input voltage and the output voltage to a first threshold,
a second comparing circuit for comparing the amplitude of the output voltage to a second threshold, and
a control circuit for commanding the switch to open or close depending on the comparisons made by the first comparing circuit and by the second comparing circuit.
Also disclosed is a regulated power-supply module comprising such a voltage-regulating circuit.

12 Claims, 5 Drawing Sheets

(56) References Cited

U.S. PATENT DOCUMENTS

| | | | | |
|---|---|---|---|---|
| 8,593,767 | B2 * | 11/2013 | Wu | H02H 7/1206 |
| | | | | 361/18 |
| 2010/0133905 | A1 * | 6/2010 | Chang | H02M 3/33561 |
| | | | | 307/31 |
| 2011/0107122 | A1 * | 5/2011 | Wang | H02M 3/33507 |
| | | | | 713/300 |
| 2014/0126258 | A1 | 5/2014 | Neyman | |

FOREIGN PATENT DOCUMENTS

| | | |
|---|---|---|
| EP | 0651499 A2 | 5/1995 |
| EP | 0763878 A2 | 3/1997 |
| EP | 2115862 A1 | 11/2009 |
| EP | 3139484 A1 | 3/2017 |
| FR | 2621751 A1 | 4/1989 |
| FR | 2719725 A1 | 11/1995 |
| JP | 2005216194 A | 8/2005 |
| JP | 2011034411 A | 2/2011 |

* cited by examiner

VOLTAGE-REGULATING CIRCUIT AND REGULATED POWER-SUPPLY MODULE

TECHNICAL FIELD

The present invention relates to a voltage-regulating circuit and to a regulated power-supply module comprising such a regulating circuit.

PRIOR ART

Many pieces of equipment that are supplied with power by a power source, such as a network for distributing electrical power, comprise a regulated power-supply module allowing an AC or DC input voltage delivered by the distributing network to be converted into a very low DC output voltage that may be used to power electronic or electromechanical circuits. The power to be transmitted between the input and output and the deviation between the input voltage and the output voltage are factors that are preponderant in the choices made with respect to the design of such power-supply modules. Power supplies using voltage transformers are widely used for their low cost; however, they require a sinusoidal input voltage and transformers are components that can be bulky or difficult to fit into a power-supply module. It is known that switch-mode power supplies are able to transmit high powers with excellent efficiency while remaining very compact. Hence, this type of power supply is commonly employed in electronic equipment the consumption of which exceeds a few watts. In contrast, when the equipment consumes very little power (typically a few hundred watts maximum) and is connected to a distributing network delivering a high input voltage (240 volts for example), the use of a switch-mode power supply often results in an expense that is disproportionate with respect to the cost of the circuits supplied with power.

Linear power-supply technology is well suited to delivery of a very low DC voltage and of a low power to a piece of equipment; however, the problem of the power that such a linear power supply must dissipate must then be addressed, said power being proportional to the voltage deviation between the input voltage and the output voltage and to the delivered supply current. Patent application DE 3304759 A1 describes a linear power-supply device using a switch that is closed only when the input voltage is low, so as to limit the dissipation of power in the switch. A capacitor accumulates the energy used when the switch is open. According to a similar principle, patent application EP 0 600 384 A2 describes a linear power-supply device that also uses a switch, the latter being controlled by a circuit that is supplied with power either by the electricity-distributing network when the input voltage is sufficient, or by a capacitor that is charged to the output voltage when the switch is open. Thus, the switch's control circuit is supplied with power whatever the state of the switch, this preventing untimely switching of said switch. Patent application FR 2 621 751 A1 invalidates any closure of the switch when the output voltage is at a sufficient level.

These prior-art documents describe low-power power-supply circuits arranged to dissipate little power. They however have the particularity of starting to operate only as the input voltage gets close to zero. This particularity is no problem when the time taken for the equipment to turn on is not critical, for example in the case of an electric razor such as described in the aforementioned document DE 3304759 A1 or in the case of small domestic appliances. In contrast, the circuits described in the prior art do not allow a power supply to deliver an output voltage very rapidly after turn-on (typically in a few milliseconds) in order to power one or more circuits intended, for example, to perform a safety function.

DISCLOSURE OF THE INVENTION

To address such a problem of decreasing dissipated internal power in association with a constraint vis-à-vis very rapid delivery of a very low output voltage after turn-on, one subject of the present invention is a voltage-regulating circuit comprising at least an input terminal, a reference terminal and an output terminal, a voltage source, which is connected between the input terminal and the reference terminal, delivering an input voltage, said regulating circuit delivering a regulated output voltage across the output terminal and the reference terminal, and comprising:
  a voltage regulator,
  a switch, connected in series with the voltage regulator between the input terminal and the output terminal, said switch and said voltage regulator forming a first assembly,
  a first comparing circuit connected to the input terminal and to the output terminal, said first comparing circuit being arranged to compare the amplitude deviation between the input voltage and the output voltage to a first threshold,
  a second comparing circuit connected to the output terminal and to the reference terminal, said second comparing circuit being arranged to compare the amplitude of the output voltage to a second threshold, and
  a control circuit connected to the first comparing circuit, to the second comparing circuit and to the switch, said control circuit being arranged to command the switch to open or close,
said regulating circuit being such that the control circuit controls the switch to open or close depending:
  on the comparison of the amplitude deviation between the input voltage and the output voltage to the first threshold, and depending
  on the comparison of the amplitude of the output voltage to the second threshold.
  Advantageously, the control circuit commands:
  the switch to open when the amplitude deviation between the input voltage and the output voltage is greater than or equal to the first threshold,
  the switch to close when the amplitude deviation between the input voltage and the output voltage is less than the first threshold, and
  the switch to close when the amplitude deviation between the input voltage and the output voltage is greater than or equal to the first threshold and the output voltage is less than the second threshold.
  Preferably, the first assembly consisting of the switch connected in series with the voltage regulator is formed by:
  a first transistor, the collector of which is connected to the input terminal, and the emitter of which is connected to the output terminal,
  a first resistor, a first end of said first resistor being connected to the base of the first transistor, a second end of the first resistor being connected to the collector of the first transistor, and
  a first voltage reference, the anode of which is connected to the reference terminal and the cathode of which is connected to the base of the first transistor.

Advantageously, the amplitude of the output voltage is set by the reference voltage delivered by the first voltage reference.

Preferably, the first comparing circuit is formed from an NPN bipolar second transistor, the collector of which is connected to the base of the first transistor and the base of which is connected to a first end of a second assembly formed by a second resistor connected in series with a second voltage reference, a second end of the second assembly being connected to the input terminal, the anode of the second voltage reference being oriented toward the base of the first transistor.

Advantageously, the amplitude of the first threshold is set by the reference voltage delivered by the second voltage reference.

Preferably, the second comparing circuit is formed from a PNP bipolar third transistor, the emitter of which is connected to the emitter of the second transistor, the collector of said third transistor being connected to the output terminal, the base being connected to a first end of a third assembly formed by a third resistor connected in series with a third voltage reference, a second end of the third assembly being connected to the reference terminal, the anode of said third voltage reference being oriented toward the reference terminal.

Advantageously, the amplitude of the second threshold is set by the reference voltage delivered by the third voltage reference.

Preferably, a fourth resistor is connected in parallel between the base and the emitter of the second transistor and a fifth resistor is connected in parallel between the base and the emitter of the third transistor.

Preferably, a capacitor is connected between the output terminal and the reference terminal.

The invention also relates to a regulated power-supply module, comprising:
- a regulating circuit such as described above,
- at least two network connection terminals connected to a network for distributing electrical power delivering an AC voltage,
- a bridge rectifier comprising AC inputs, a positive output and a negative output, the AC inputs being connected to the network connection terminals, the positive output being connected to the input terminal of the regulating circuit, the negative output being connected to the reference terminal of the regulating circuit.

Advantageously, the regulated power-supply module comprises a buck switch-mode converter, an input of said switch-mode converter being connected to the output terminal of the regulating circuit and an output of the switch-mode converter delivering a regulated supply voltage.

BRIEF DESCRIPTION OF THE DRAWINGS

Other advantages and features will become more clearly apparent from the following description of particular embodiments of the invention, which are given by way of non-limiting example and shown in the appended drawings, in which.

DETAILED DESCRIPTION OF PREFERRED EMBODIMENTS

Figure 1:
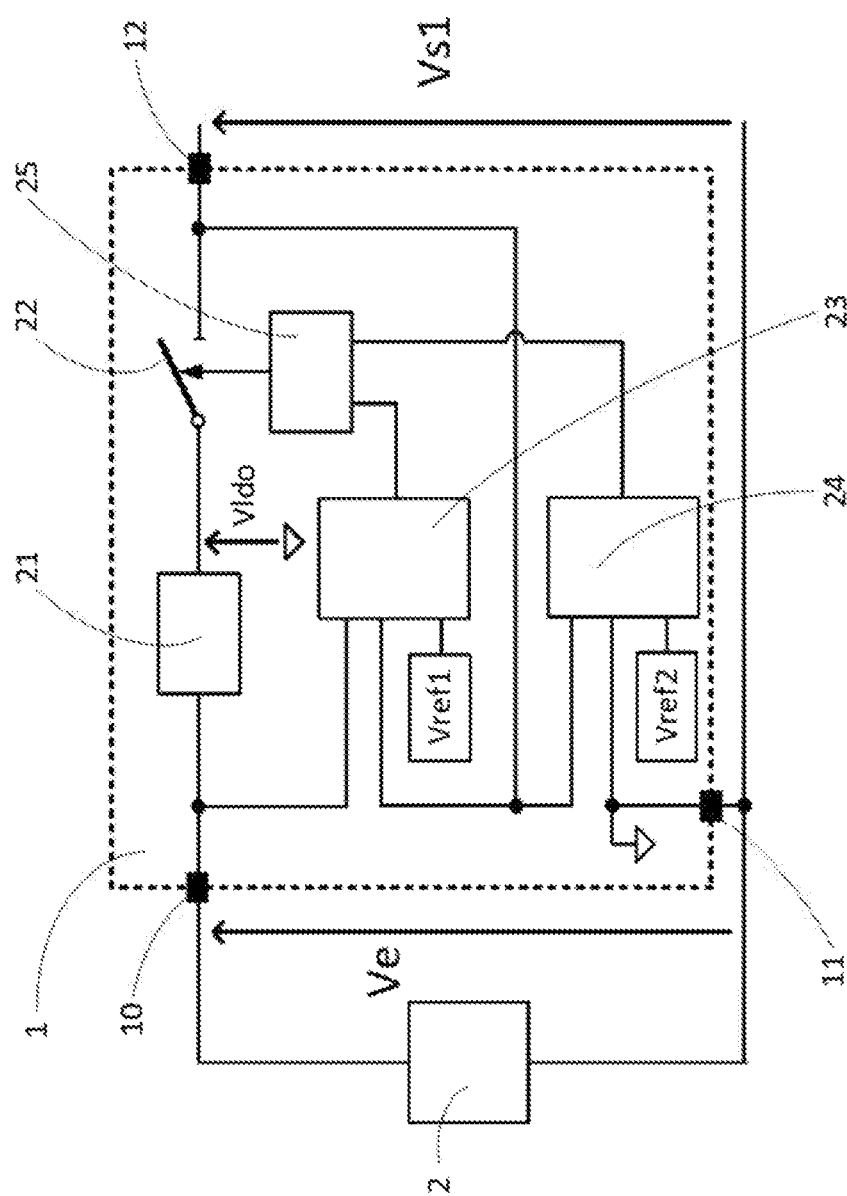
FIG. 1 shows, in the form of a block diagram, a voltage-regulating circuit.

FIG. 1 shows, in the form of a block diagram, a voltage-regulating circuit 1 comprising at least an input terminal 10, a reference terminal 11 and an output terminal 12. A voltage source 2 is connected between the input terminal 10 and the reference terminal 11 and delivers an input voltage Ve. Said regulating circuit 1 is arranged to deliver a regulated output voltage Vs1 across the output terminal 12 and the reference terminal 11. To this end, the regulating circuit 1 comprises:
- a voltage regulator 21,
- a switch 22, connected in series with the voltage regulator 21 between the input terminal 10 and the output terminal 12, said switch 22 and said voltage regulator 21 forming a first assembly,
- a first comparing circuit 23 connected to the input terminal 10 and to the output terminal 12, said first comparing circuit 23 being arranged to compare the amplitude of the deviation between the input voltage Ve and the output voltage Vs1 to a first threshold Vref1,
- a second comparing circuit 24 connected to the output terminal 12 and to the reference terminal 11, said second comparing circuit 24 being arranged to compare the amplitude of the output voltage Vs1 to a second threshold Vref2, and
- a control circuit 25 connected to the first comparing circuit 23, to the second comparing circuit 24 and to the switch 22, said control circuit 25 being arranged to command the switch 22 to open or close depending on the comparison of the amplitude deviation between the input voltage Ve and the output voltage Vs1 to the first threshold Vref1, and depending on the comparison of the amplitude of the output voltage Vs1 to the second threshold Vref2. This technical effect allows the output voltage Vs1 to be delivered independently of the phase angle of the input voltage Ve at the moment of the connection of the control circuit to the voltage source 2, in contrast to the devices described with respect to the prior art, which must wait for the input voltage to get close to zero before delivering an output voltage Vs1.

Preferably, the control circuit 25 commands:
- the switch 22 to open when the amplitude deviation between the input voltage Ve and the output voltage Vs1 is greater than or equal to the first threshold Vref1,
- the switch 22 to close when the amplitude deviation between the input voltage Ve and the output voltage Vs1 is less than the first threshold Vref1, and
- the switch 22 to close when the amplitude deviation between the input voltage Ve and the output voltage Vs1 is greater than or equal to the first threshold Vref1 and the output voltage Vs1 is less than the second threshold Vref2.

The input voltage Ve delivered by the voltage source 2 may be a half- or full-wave rectified AC voltage, a DC voltage on which one or more AC voltages are superposed or even a slowly varying DC voltage. The amplitude of the input voltage Ve varies, for example, between 0 volts and 400 volts.

The output of the voltage regulator 21, which output is connected to the switch 22, delivers a regulated voltage Vldo, which is referenced with respect to the potential of the reference terminal 11. The regulated voltage Vldo is preferably comprised between 10 and 50 volts.

The regulated output voltage Vs1 is a DC voltage that is smooth or that comprises a ripple.

Figure 2:
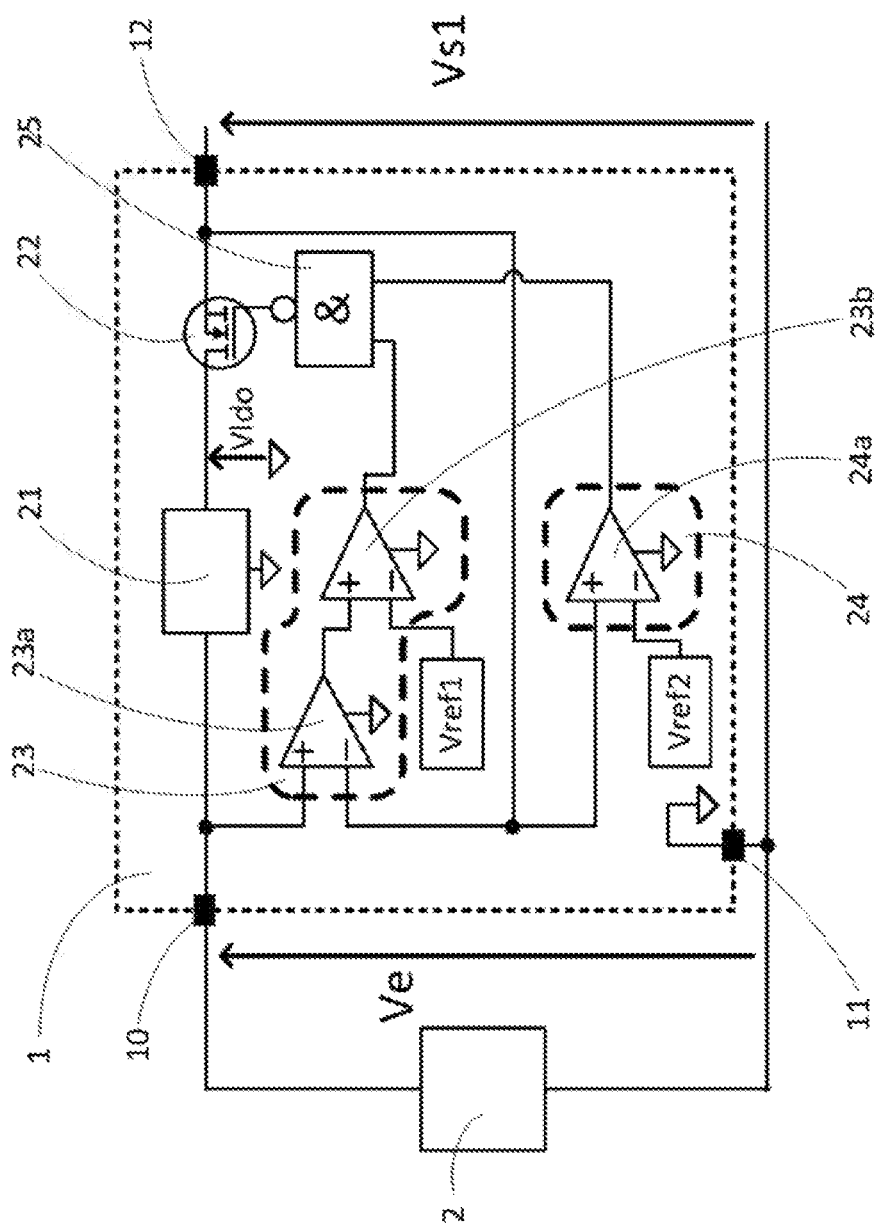
FIG. 2 shows a first embodiment of the regulating circuit.

FIG. 2, which should be read with reference to the block diagram in FIG. 1, shows a first embodiment of the regulating circuit 1. The voltage regulator 21 is preferably a conventional linear voltage-regulating circuit, this type of circuit also being referred to as a low-dropout (LDO) regulator, this type of circuit having the advantage of a low voltage drop between its input and its output, such as a circuit of the 78 family from STMicroelectronics or an LM338 circuit from Texas Instrument.

The input of the voltage regulator is connected to the input terminal 10.

The switch 22 is formed by at least a bipolar transistor or a metal-oxide semiconductor field-effect transistor (MOS-FET) or even a JFET made of silicon carbide (SiC) or any other component allowing electrical current to be rapidly switched and the series resistance of which in the on state is low. Such a transistor is connected in series between the output of the voltage regulator 21 and the output terminal 12.

The first comparing circuit 23 comprises a differential amplifier 23a a positive input of which is connected to the input terminal 10 and a negative input of which is connected to the output terminal 12. The output of the differential amplifier 23a is connected to a positive input of a first voltage comparator 23b in order to deliver a voltage the amplitude of which is equal to the amplitude deviation between the input voltage Ve and the output voltage Vs1. The positive input of the first comparator 23b is therefore raised to a potential equal to (Ve−Vs1). A negative input of the first comparator 23b is connected to a first voltage reference Vref1. An output of the first comparator 23b delivers a result of the comparison of the amplitude deviation between the input voltage Ve and the output voltage Vs1 to the first threshold Vref1. The first comparator 23b therefore compares the potential (Ve−Vs1) to the potential Vref1. When the potential (Ve−Vs1) is greater than the potential Vref1, the output of the first comparator 23b passes to a high state, else the output of the first comparator 23b is in a low state.

The second comparing circuit 24 comprises a second voltage comparator 24a in order to compare the amplitude of the output voltage Vs1 to a second voltage threshold Vref2. To this end, the output terminal 12 is connected to a positive input of the second comparator 24a in order to deliver a voltage the amplitude of which is equal to the output voltage Vs1. A negative input of the second comparator 24a is connected to a second voltage reference Vref2. When the output voltage Vs1 is greater than the potential of the second threshold Vref2, the output of the second comparator 24a passes to a high state, else the output of the second comparator 24a is in a low state.

A first input of the control circuit 25 is connected to the output of the first comparator 23b; a second input of the control circuit 25 is connected to the output of the second comparator 24a. The first control circuit 25 is preferably an NAND logic gate, the output of which is in a low state when its two inputs are in a high state. Said output of the first control circuit 25 is connected to a control electrode of the switch 22, a base of a bipolar transistor or an FET gate for example. A high state at the output of the first control circuit 25 turns on the transistor and therefore closes the switch 22. Such a high state at the output of the first control circuit 25 is obtained when one of its inputs is in a low state or even when the potential difference (Ve−Vs1) is less than the potential Vref1 or when the output voltage Vs1 is less than the potential of the second threshold Vref2. In contrast, when the two inputs of the control circuit 25 are in a high state, i.e. when the potential difference (Ve−Vs1) is greater than the potential Vref1 and the output voltage Vs1 is greater than the potential of the second threshold Vref2, then the output of the first control circuit 25 passes to a low state and thus the switch 22 is controlled open.

The control logic thus described and executed by the control circuit 25 makes it possible to command:
- the switch 22 to close when the amplitude deviation between the input voltage Ve and the output voltage Vs1 is less than or equal to the first threshold Vref1, this allowing the voltage regulator 21 to operate so as to deliver a regulated output voltage Vs1,
- the switch 22 to open when the amplitude deviation between the input voltage Ve and the output voltage Vs1 is greater than or equal to the first threshold Vref1, this preventing any dissipation of power in the voltage regulator 21, and
- the switch 22 to close when the amplitude deviation between the input voltage Ve and the output voltage Vs1 is greater than or equal to the first threshold Vref1 and the output voltage Vs1 is less than the second threshold Vref2, this allowing the output voltage Vs1 to be delivered as soon as an input voltage Ve appears, the latter configuration being particularly important at the moment when the regulating circuit is turned on in order to allow a receiver connected between the output terminal 12 and the reference terminal 11 to be supplied with power. This time period lasts only a few milliseconds and the power dissipated in the voltage regulator 21 remains low.

The control logic of the switch 22 described above privileges closure of the switch 22 except in the case where the potential difference (Ve−Vs1) is greater than the potential Vref1 and the output voltage Vs1 is greater than the potential of the second threshold Vref2. Depending on said logic, closing the switch 22 when the input voltage Ve is greater than or equal to the first threshold Vref1 and the output voltage Vs1 is less than the second threshold Vref2 takes priority over opening the switch 22 when the input voltage Ve is greater than or equal to the first threshold Vref1.

As a variant, the control logic of the switch 22 may easily be modified to cause the switch 22 to open in the case where the potential difference (Ve−Vs1) is less than the potential Vref1 and the output voltage Vs1 is greater than the potential of the second threshold Vref2, for example in the case where no power is consumed between the output terminal 12 and the reference terminal 11.

According to another variant, the switch 22 may be managed solely depending on the amplitude of the input voltage Ve and of the output voltage Vs1. In this case, the differential amplifier 23a is not necessary, the positive input of the first voltage comparator 23b being connected to the input terminal 10. The output of the first comparator 23b thus delivers a result of the comparison between the input voltage Ve and the first threshold Vref1, the first threshold Vref1 being adjusted accordingly. The control circuit 25 executes the control logic described above.

According to another variant, the first and second comparing circuits 23, 24 and the control circuit 25 may be achieved by means of one or more microcontrollers or microprocessors or any device comprising analog-digital converting circuits and circuits suitable for carrying out information processing.

According to yet another variant, the voltage regulator 21 and the switch 22 are integrated into the same component, such as a linear voltage regulator possessing an ON/OFF control input, for example a circuit bearing the reference "LM9070 Low-Dropout System Voltage Regulator with Keep-Alive ON/OFF Control" from Texas Instrument.

Figure 3:
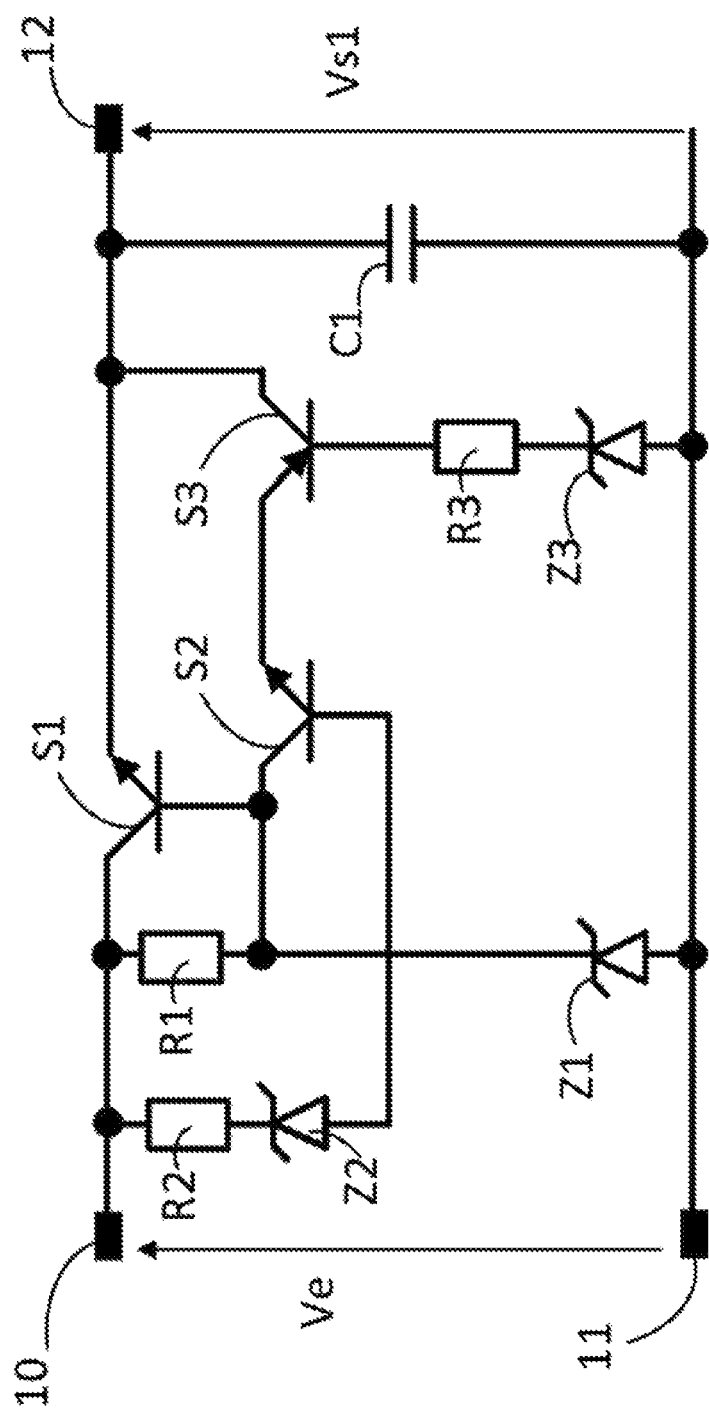
FIG. 3 shows a diagram of the regulating circuit according to one preferred embodiment.

FIG. 3 is a diagram of one preferred embodiment of the regulating circuit described above. This embodiment requires very few components; therefore, it is extremely economical.

The first assembly consisting of the switch 22 connected in series with the voltage regulator 21 is formed by:
- a first transistor S1 (preferably an NPN bipolar transistor) the collector of which is connected to the input terminal 10, and the emitter of which is connected to the output terminal 12,
- a first resistor R1, a first end of said first resistor R1 being connected to the base of the first transistor S1, a second end of the first resistor R1 being connected to the collector of the first transistor S1, and
- a first voltage reference Z1 the anode of which is connected to the reference terminal 11 and the cathode of which is connected to the base of the first transistor S1.

In the case where the first transistor S1 is a JFET, MOSFET, IGBT or n-channel SiC, it is recommendable to connect the drain of the transistor instead of the collector, the gate instead of the base and the source instead of the emitter.

The amplitude of the output voltage Vs1 is set by the reference voltage delivered by the first voltage reference Z1. Specifically, the output voltage Vs1 is equal to the reference voltage delivered by the first voltage reference Z1, from which it is recommendable to subtract the base-emitter voltage of the first transistor S1, which is for example substantially equal to 0.6 volts for a bipolar first transistor S1.

Preferably, the first voltage reference Z1 is a Zener diode. Preferably, the reference voltage delivered by said first voltage reference Z1 is comprised between 10 volts and 90 volts.

The first comparing circuit 23 is formed from a second transistor S2, preferably an NPN bipolar transistor, the collector of which is connected to the base of the first transistor S1 and the base of which is connected to a first end of a second assembly formed by a second resistor R2 connected in series with a second voltage reference Z2, a second end of the second assembly being connected to the input terminal 10. The anode of the second voltage reference Z2 is oriented toward the base of the second transistor S2.

Figure 4:
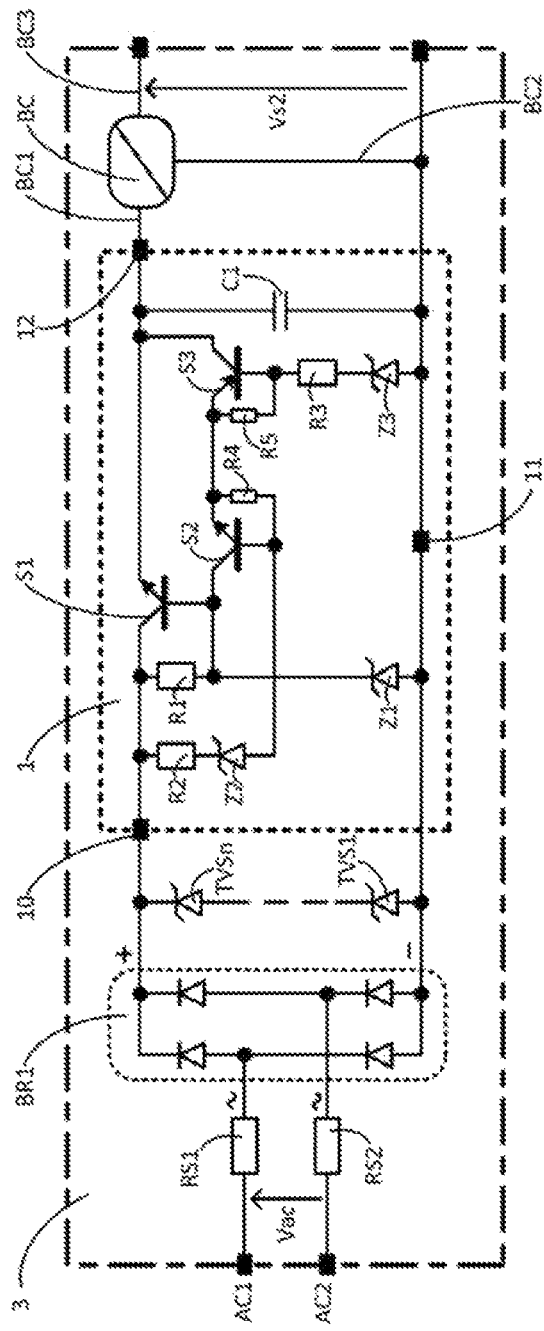
FIG. 4 shows a diagram of a regulated power-supply module.

The amplitude of the first threshold Vref1 is set by the reference voltage delivered by the second voltage reference Z2, as will be explained below. Preferably, the second voltage reference Z2 is a Zener diode. Preferably, the reference voltage delivered by said second voltage reference Z2 is comprised between 50 volts and 90 volts. The positions of the second resistor R2 and of the second voltage reference Z2 may be swapped, while remaining in series and provided that the anode of the second voltage reference Z2 is oriented toward the base of the second transistor S2. FIGS. 3 and 4 show the anode of the second voltage reference Z2 connected to the base of the second transistor S2 and a first end of the second resistor R2 connected to the input terminal 10. It is also possible to connect the cathode of the second voltage reference Z2 to the input terminal 10 and to connect the first end of the second resistor R2 to the anode of the second voltage reference Z2.

The second comparing circuit 24 is formed from a third transistor S3, preferably a PNP bipolar transistor, the emitter of which is connected to the emitter of the second transistor S2, the collector of said third transistor S3 being connected to the output terminal 12 and the base being connected to a first end of a third assembly formed by a third resistor R3 connected in series with a third voltage reference Z3, a second end of said third assembly being connected to the reference terminal 11, the anode of said third voltage reference Z3 being oriented toward the reference terminal 11.

The amplitude of the second threshold Vref2 is set by the reference voltage delivered by the third voltage reference Z3. Preferably, the third voltage reference Z3 is a Zener diode. Preferably, the reference voltage delivered by said third voltage reference Z3 is comprised between 5 volts and 20 volts. The positions of the third resistor R3 and of the third voltage reference Z3 may be swapped, while remaining in series and provided that the anode of the third voltage reference Z3 is oriented toward the reference terminal 11. FIGS. 3 and 4 show the anode of the third voltage reference Z3 connected to the reference terminal 11 and a first end of the third resistor R3 connected to the cathode of the third voltage reference Z3. It is also possible to connect the cathode of the third voltage reference Z3 to the base of the third transistor S3 and to connect the first end of the third resistor R3 to the reference terminal 11.

When the voltage across the input terminal 10 and the output terminal 12 is greater than the reference voltage delivered by the second voltage reference Z2, a current flows through the second resistor R2, the second voltage reference Z2, the base of the second transistor S2 and the emitter of the third transistor S3. When the output voltage Vs1 is greater than the reference voltage delivered by the third voltage reference Z3, the second transistor S2 and the third transistor S3 turn on and the first transistor S1 turns off: it is a question of the case where the amplitude deviation between the input voltage Ve and the output voltage Vs1 is greater than or equal to the first threshold Vref1 and the output voltage Vs1 is greater than or equal to the second threshold Vref2. In contrast, when the output voltage Vs1 is less than the reference voltage delivered by the third voltage reference Z3, the second transistor S2 and the third transistor S3 turn off. In this case, the first transistor S1 turns on: it is a question of the case where the amplitude deviation between the input voltage Ve and the output voltage Vs1 is greater than or equal to the first threshold Vref1 and the output voltage Vs1 is less than or equal to the second threshold Vref2, i.e. of turn on of the regulating circuit when the output voltage Vs1 is low.

When the voltage across the input terminal 10 and the output terminal 12 is less than the reference voltage delivered by the second voltage reference Z2, the second transistor S2 turns off and the first transistor S1 operates in a voltage-regulator or LDO mode and delivers a regulated output voltage Vs1 of amplitude substantially equal to the reference voltage delivered by the first voltage reference Z1 as described above.

A capacitor C1, connected between the output terminal 12 and the reference terminal 11, forms a reservoir of energy that allows the circuits connected between the output terminal 12 and the reference terminal 11 to be powered when the first transistor S1 is turned off.

The invention also relates to a regulated power-supply module 3 comprising a regulating circuit 1 such as described above. FIG. 4 shows a diagram of a preferred embodiment of such a regulated power-supply module, this embodiment comprising:
  a regulating circuit 1 such as described above,
  at least two network connection terminals AC1, AC2 for connecting the regulated power-supply module 3 to a network for distributing electrical power delivering an AC voltage Vac,
  a bridge rectifier BR1 comprising AC inputs, a positive output and a negative output, the AC inputs being connected to the network connection terminals AC1, AC2, the positive output being connected to the input terminal 10 of the regulating circuit 1, the negative output being connected to the reference terminal 11 of the regulating circuit 1.

Preferably, the voltage-limiting components RS1, RS2, TVS1, ..., TVSn are connected in series between the input terminal 10 and the reference terminal 11 in order to clip over voltages transmitted by the network for distributing electrical power. The number of limiting components TVS1, ..., TVSn is determined depending on the overvoltage level from which the AC voltage Vac must be clipped.

To improve the behaviour of the regulating circuit in the presence of electromagnetic interference, a fourth resistor R4 is connected in parallel between the base and the emitter of the second transistor S2 and a fifth resistor R5 is connected in parallel between the base and the emitter of the third transistor S3. The fourth and fifth resistor R4 and R5 preferably have a resistance comprised between 10 kohms and 470 kohms.

The regulated power-supply module 3 comprises a switch-mode converter BC, preferably a buck series chopper, an input BC1 of said switch-mode converter BC being connected to the output terminal 12 of the regulating circuit 1, a reference input BC2 being connected to the reference terminal 11 and an output BC3 of the switch-mode converter delivering a supply voltage Vs2 that is regulated with respect to the reference terminal 11. Said regulated supply voltage Vs2 may be used to power, for example, signal-processing circuits in a device for protecting against fault currents, such as a differential circuit breaker. A regulated power-supply module 3 may also be used in any piece of equipment requiring, at a voltage Vs2, power to be supplied extremely rapidly, for example within a few milliseconds of turn on, such as a device for protecting against electrical faults, a medical monitoring device or even a controller operating in the context of a continuous process, this list being non-limiting.

Figures 5A, 5B:
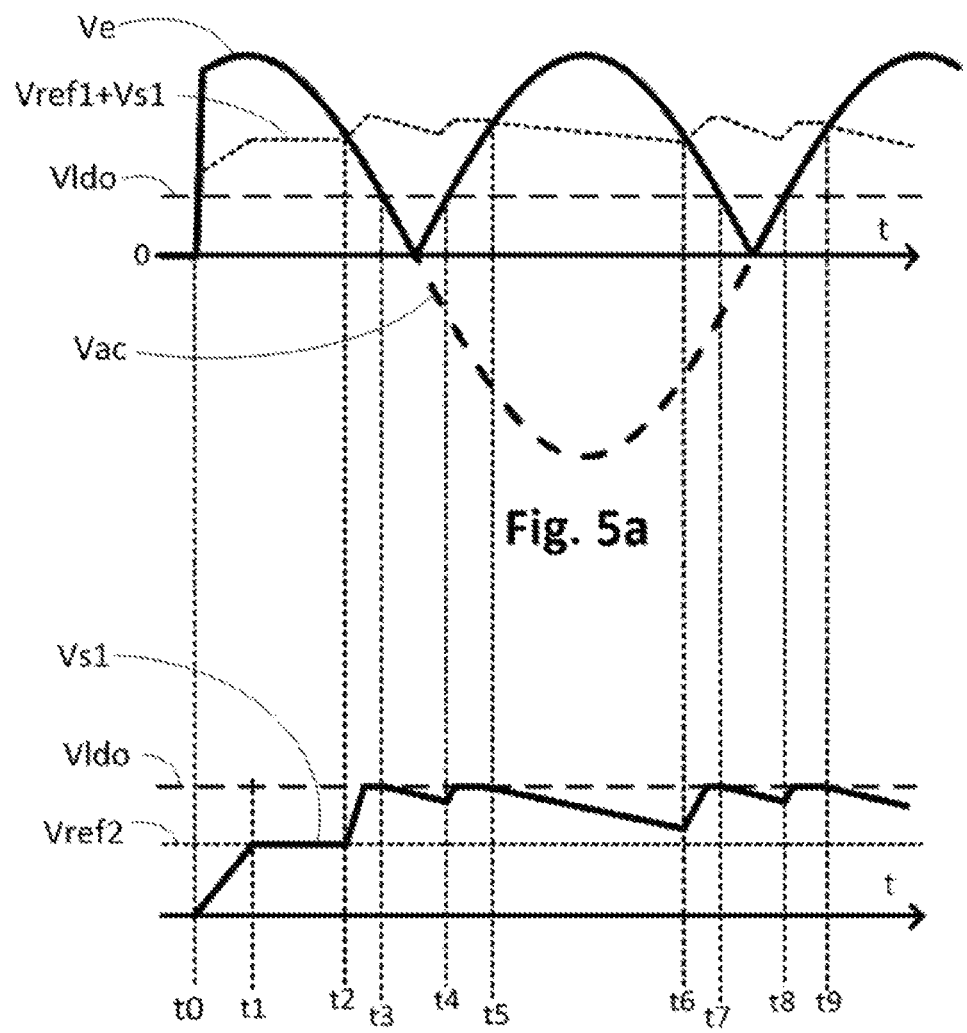
FIGS. 5a and 5b are representations showing, as a function of time, the variation in an input voltage of the power-supply module and in a regulated output voltage delivered by the power-supply module.

FIG. 5a is a representation showing, as a function of time, the variation in the AC voltage Vac delivered by the network for distributing electrical power and in the input voltage Ve at the input of the regulating circuit 1, the voltage Ve being obtained by rectifying, by means of the bridge rectifier BR1, the AC voltage Vac. For the sake of the clarity of the following description, the threshold level Vref1+Vs1 and the level of the regulated voltage Vldo are also shown, as a function of time t.

FIG. 5b is a representation showing, as a function of time, the regulated output voltage Vs1 delivered by the regulating circuit 1. At the time t0, the regulating circuit 1 receives the input voltage Ve, the latter corresponding to the full-wave rectified AC voltage Vac. The output voltage Vs1 is zero. The first comparing circuit 23 compares the potential difference (Ve−Vs1) to Vref1, this amounting to comparing the input voltage Ve to the sum (Vref1+Vs1). On the one hand, the input voltage Ve being greater than the sum of the output voltage Vs1 and of the first threshold Vref1 and, on the other hand, the output voltage Vs1 being less than the second threshold Vref2, the switch 22 is closed, the voltage regulator 21 operates and the capacitor C1 starts to charge. The output voltage Vs1 increases until it reaches the second threshold Vref2 at the time t1. The control circuit 25 then commands the switch 22 to open, and the capacitor C1 remains charged under a voltage corresponding to the second threshold Vref2. At the time t2, the input voltage Ve is less than the sum of the output voltage Vs1 and of the first threshold Vref1 and therefore the switch 22 is closed. The voltage regulator 21 operates and delivers the regulated voltage Vldo allowing further charging of the capacitor C1, and the output voltage Vs1 tends to the value of the regulated voltage Vldo. At the time t3, the input voltage Ve drops below the value of the regulated voltage Vldo, the regulator stops operating and the capacitor C1 discharges, thereby delivering the power consumed by the circuits connected to the power-supply module 3. At the time t4, the input voltage Ve becomes greater than the value of the regulated voltage Vldo, the voltage regulator 21 begins to operate again and delivers the regulated voltage Vldo allowing further charging of the capacitor C1, then the output voltage Vs1 stabilizes at the value of the regulated voltage Vldo. At the time t5, on the one hand the input voltage Ve becomes greater than the sum of the output voltage Vs1 and, on the other hand, the output voltage Vs1 is greater than the second threshold Vref2, then the control circuit 25 commands the switch 22 to open and the capacitor C1 discharges, thereby delivering the power consumed by the circuits connected to the power-supply module 3 up to the time t6. At this instant, the input voltage Ve becomes less than the sum of the output voltage Vs1 and of the first threshold Vref1 and therefore the switch 22 is closed, the voltage regulator 21 operates, completes the charging of the capacitor C1 and regulates the output voltage Vs1 to the value of the regulated voltage Vldo, just as in the period between t2 and t3, up to the time t7. Next, an identical cycle is repeated.

The voltage-regulating circuit 1 allows an output voltage Vs1 to be delivered very rapidly after turn-on, the time interval between the time t1 and the time t0 typically being a few milliseconds, including in the case where the amplitude of the input voltage Ve is very large with respect to the output voltage Vs1. In addition, the operation of the voltage-regulating circuit 1 leads to a notable decrease in ohmic losses in the voltage regulator 21. Lastly, the regulating circuit, most particularly as shown in and described with reference to FIG. 3, may be produced with a low number of components, in an extremely small volume, this being very attractive economically.

The invention claimed is:

1. A voltage-regulating circuit comprising at least an input terminal, a reference terminal and an output terminal, a voltage source, which is connected between the input terminal and the reference terminal, delivering an input voltage, said voltage-regulating circuit delivering a regulated output voltage across the output terminal and the reference terminal, and comprising:
  a voltage regulator,
  a switch, connected in series with the voltage regulator between the input terminal and the output terminal, said switch and said voltage regulator forming a first assembly,
  a first comparing circuit connected to the input terminal and to the output terminal, said first comparing circuit being arranged to compare the amplitude deviation between the input voltage and the output voltage to a first threshold, a second comparing circuit connected to the output terminal and to the reference terminal, said second comparing circuit being arranged to compare the amplitude of the output voltage to a second threshold, and a control circuit connected to the first comparing circuit, to the second comparing circuit and to the switch, said control circuit being arranged to command the switch to open or close, wherein the control circuit controls the switch to open or close depending:

on the comparison of the amplitude deviation between the input voltage and the output voltage to the first threshold, and on the comparison of the amplitude of the output voltage to the second threshold.

2. The voltage-regulating circuit according to claim 1, wherein the control circuit commands:

the switch to open when the amplitude deviation between the input voltage and the output voltage is greater than or equal to the first threshold, the switch to close when the amplitude deviation between the input voltage and the output voltage is less than the first threshold, and the switch to close when the amplitude deviation between the input voltage and the output voltage is greater than or equal to the first threshold and the output voltage is less than the second threshold.

3. The voltage-regulating circuit according to claim 1, wherein the first assembly comprising the switch connected in series with the voltage regulator is formed by:

a first transistor, the collector of which is connected to the input terminal, and the emitter of which is connected to the output terminal, a first resistor, a first end of said first resistor being connected to the base of the first transistor, a second end of the first resistor being connected to the collector of the first transistor, and a first voltage reference, the anode of which is connected to the reference terminal and the cathode of which is connected to the base of the first transistor.

4. The voltage-regulating circuit according to claim 3, wherein the amplitude of the output voltage is set by the reference voltage delivered by the first voltage reference.

5. The voltage-regulating circuit according to claim 3, wherein the first comparing circuit is formed from an NPN bipolar second transistor, the collector of which is connected to the base of the first transistor and the base of which is connected to a first end of a second assembly formed by a second resistor connected in series with a second voltage reference, a second end of the second assembly being connected to the input terminal, the anode of the second voltage reference being oriented toward the base of the first transistor.

6. The voltage-regulating circuit according to claim 5, wherein the amplitude of the first threshold is set by the reference voltage delivered by the second voltage reference.

7. The voltage-regulating circuit according to claim 5, wherein the second comparing circuit is formed from a PNP bipolar third transistor the emitter of which is connected to the emitter of the second transistor, the collector of said third transistor being connected to the output terminal, the base being connected to a first end of a third assembly formed by a third resistor connected in series with a third voltage reference, a second end of the third assembly being connected to the reference terminal, the anode of said third voltage reference being oriented toward the reference terminal.

8. The voltage-regulating circuit according to claim 7, wherein the amplitude of the second threshold is set by the reference voltage delivered by the third voltage reference.

9. The voltage-regulating circuit according to claim 7, wherein a fourth resistor is connected in parallel between the base and the emitter of the second transistor and in that a fifth resistor is connected in parallel between the base and the emitter of the third transistor.

10. The voltage-regulating circuit according to claim 1, wherein a capacitor is connected between the output terminal and the reference terminal.

11. A regulated power-supply module, comprising:
a voltage-regulating circuit according to claim 1,
at least two network connection terminals connected to a network for distributing electrical power delivering an AC voltage,
a bridge rectifier comprising AC inputs, a positive output and a negative output, the AC inputs being connected to the network connection terminals, the positive output being connected to the input terminal of the voltage-regulating circuit, the negative output being connected to the reference terminal of the voltage-regulating circuit.

12. The regulated power-supply module according to claim 11, further comprising a buck switch-mode converter, an input of said buck switch-mode converter being connected to the output terminal of the voltage-regulating circuit and an output of the buck switch-mode converter delivering a regulated supply voltage.

* * * * *